US006740425B2

(12) United States Patent
Seita et al.

(10) Patent No.: US 6,740,425 B2
(45) Date of Patent: May 25, 2004

(54) METHOD FOR MANUFACTURING COPPER-RESIN COMPOSITE MATERIAL

(75) Inventors: Masaru Seita, Kitaadachi-gun (JP); Hideki Tsuchida, Hasuda (JP); Masaaki Imanari, Misato (JP); Yoshihiro Sugita, Kitaadachi-gun (JP)

(73) Assignee: Shipley Company, L.L.C., Marlborough, MA (US)

( * ) Notice: Subject to any disclaimer, the term of this patent is extended or adjusted under 35 U.S.C. 154(b) by 0 days.

(21) Appl. No.: 10/224,831

(22) Filed: Aug. 21, 2002

(65) Prior Publication Data

US 2003/0066754 A1 Apr. 10, 2003

(30) Foreign Application Priority Data

Aug. 21, 2001 (JP) ........................................ 2001-250441

(51) Int. Cl.$^7$ ......................... B32B 15/08; C23C 28/02; C25D 5/02; C25D 5/56
(52) U.S. Cl. ......................... 428/626; 428/621; 427/98; 427/306; 205/126; 205/169; 205/187
(58) Field of Search .................. 205/126, 167–169, 205/187; 427/98, 304–306, 437, 443.1; 428/545, 332, 335–336, 457–465, 416, 418, 615, 621, 624, 625, 626

(56) References Cited

U.S. PATENT DOCUMENTS

| | | | | |
|---|---|---|---|---|
| 5,374,346 A | * | 12/1994 | Bladon et al. | 205/125 |
| 5,908,543 A | * | 6/1999 | Matsunami et al. | 205/159 |
| 6,331,239 B1 | * | 12/2001 | Shirota et al. | 205/167 |
| 6,461,678 B1 | * | 10/2002 | Chen et al. | 427/304 |
| 2002/0197492 A1 | * | 12/2002 | Hao et al. | 428/457 |

* cited by examiner

Primary Examiner—Philip Tucker
Assistant Examiner—Michael J Feely
(74) Attorney, Agent, or Firm—S. Matthew Cairns

(57) ABSTRACT

A method for forming copper-resin composite materials is disclosed. This method affixes a palladium or palladium-tin catalyst onto resin substrate, and then subjects the catalyst-containing resin to an electroless copper plating bath without performing a catalyst acceleration treatment step.

12 Claims, No Drawings

METHOD FOR MANUFACTURING COPPER-RESIN COMPOSITE MATERIAL

BACKGROUND OF THE INVENTION

The present invention relates to a method for manufacturing copper-resin composite materials. In addition, the present invention relates to a copper-resin composite intermediate material used in the aforementioned method for manufacturing copper-resin composite materials.

In the past, when manufacturing copper-resin composite materials such as printed circuit boards, copper-resin composite intermediate materials have been used which are composed of a copper thin film on a resin substrate. In the process whereby the target copper-resin composite material is to be manufactured, the copper-resin composite intermediate material is subjected to an electrolytic copper plating treatment or pattern formation process.

One method for manufacturing this type of copper-resin composite intermediate material involves affixing palladium or palladium-tin catalyst onto the resin substrate, and then carrying out treatment with an electroless copper plating bath containing copper ions and reducing agent, without subjecting said catalyst to an acceleration treatment using sulfuric acid, etc. The copper-resin composite intermediate material manufactured by means of this method has a copper thin film that is more uniform and fine-grained than is obtained by common electroless copper plating methods (in this specification, the term "common electroless copper plating methods" refers to methods in which the palladium-tin catalyst is subjected to an acceleration treatment with sulfuric acid, etc., followed by the formation of a copper thin film by treatment in a bath containing copper ions and formaldehyde). In addition, there are the advantages that the deposition rate of electrolytic copper is faster during the electrolytic copper plating treatment, and the deposited electrolytic copper is more uniform and fine-grained relative to cases where the base is a copper thin film formed by a common electrolytic copper plating treatment.

In ordinary copper-resin composite material manufacture processes, a material that has been manufactured and stored is used as the copper-resin composite intermediate material. In such cases, an oxide film is formed on the copper thin film surface during the time when the copper-resin composite intermediate material is stored, and when an electrolytic copper plating treatment is then carried out directly on this oxide film, there is the disadvantage that separation of the copper layer in the resulting copper-resin composite material readily occurs. For this reason, when a copper-resin composite intermediate material is to be subjected to electrolytic copper plating, ordinarily, a degreasing treatment, or degreasing treatment followed by an etching treatment, is carried out to remove the oxide film prior to the electrolytic copper plating treatment. In addition, it is necessary to carry out a similar treatment not only when oxide film has been formed, but even when the copper thin film has been contaminated with other materials. Contaminants can thereby be removed.

When the copper-resin composite material is to be subjected to a patterning treatment, a resist layer is formed on the copper thin film of the copper-resin composite intermediate material, and the patterning treatment is carried out. In this case, the copper thin film is ordinarily subjected to an etching treatment or polishing treatment in order to improve binding between the resist layer and copper thin film.

As described above, copper-resin composite intermediate materials used as intermediate materials in the manufacture of copper-resin composite materials are often subjected to a degreasing treatment, etching treatment or polishing treatment, and so a material is desired that can withstand these treatments.

In common electrolytic copper plating methods in which palladium-tin catalyst is subjected to an acceleration treatment in a solution having sulfuric acid or other such substance as a base, and a copper thin film is then formed by treatment with a bath containing copper ions and formaldehyde, it is possible to use a thick electroless copper plating method to form a deposited copper thin film at a thickness that can withstand the degreasing treatment, etching treatment or polishing treatment (1.5–2.5 $\mu$m).

However, with copper-resin composite intermediate materials manufactured by means of affixing palladium or palladium-tin catalyst to resin substrate, and treating this material in an electroless copper plating bath containing copper ions and reducing agent, without subjecting said catalyst to an acceleration treatment using a solution having sulfuric acid or other such substance as a base, the copper thin film has a film thickness of about 0.08 $\mu$m or less when said electroless copper plating bath does not contain formaldehyde, and there are cases where the copper thin film will not withstand an etching treatment. For this reason, when manufacturing a copper-resin composite intermediate material by the above method, there are cases where there are disadvantages of separation of the electrolytic copper plating layer and insufficient pattern formation.

In addition, in methods in which palladium or palladium-tin catalyst is affixed to the resin substrate, and treatment is carried out with an electroless copper plating bath containing copper ions and reducing agent, without subjecting said catalyst to an acceleration treatment using a solution having sulfuric acid or other such substance as a base, it is possible to manufacture a copper-resin composite intermediate material with a copper thin film thickness of about 0.08 $\mu$m or greater when the plating bath containing copper ions and reducing agent contains formaldehyde. However, a long period of time is required for the formation of a copper thin film of sufficient thickness to withstand the etching treatment or polishing treatment for the copper-resin composite intermediate material.

SUMMARY OF THE INVENTION

The present invention attempts to solve new problems of the type described above that are not present in ordinary common electrolytic copper plating methods, but have arisen with the development of electroless copper plating methods in which palladium or palladium-tin catalyst is affixed to the resin substrate, and treatment is carried out with an electroless copper plating bath containing copper ions and reducing agent, without subjecting said catalyst to an acceleration treatment using a solution containing sulfuric acid or other such substance as a base.

Specifically, the present invention provides a copper-resin composite intermediate material that can withstand etching treatment or polishing treatment subsequent to an electrolytic copper plating treatment carried out prior to the formation of an oxide film on the copper thin film, where this copper thin film is formed on a resin substrate by affixing palladium or palladium-tin catalyst to the resin substrate, followed by treatment with an electroless copper plating bath containing copper ions and reducing agent to form a copper thin film on the resin substrate, without subjecting said catalyst to an acceleration treatment using a solution containing sulfuric acid or other substance as a base. In addition, the present invention provides a method for manufacturing copper-resin composite materials that includes a process for manufacturing said copper-resin composite intermediate material, where the production costs and treatment time are reduced relative to thick electrolytic copper plating treatments.

The present invention relates to a method for forming copper-resin composite materials, comprising 1) affixing palladium or palladium-tin catalyst onto resin substrate, 2) treating a resin substrate with affixed catalyst with an electroless copper plating bath containing copper ions and reducing agent, without performing a catalyst acceleration treatment, thereby forming a copper thin film on the resin substrate, 3) subjecting the resin substrate having said copper thin film to an electrolytic copper plating treatment prior to the formation of oxide film on the copper thin film surface of the resin substrate, thus forming a copper-resin composite intermediate material, (4) etching or polishing the copper-resin composite intermediate material, and 5) subjecting the etched or polished copper-resin composite intermediate material is subjected to an electrolytic copper plating treatment or pattern formation treatment to form the copper-resin composite material.

In addition, the present invention relates to a copper-resin composite intermediate material used in the aforementioned method for forming copper-resin composite materials.

In addition, the present invention relates to a copper-resin composite material formed by means of the aforementioned method for forming copper-resin composite materials.

DETAILED DESCRIPTION OF THE INVENTION

The method for manufacturing copper-resin composite materials of the present invention includes the step: "(1) affixing palladium or palladium-tin catalyst to a resin substrate".

The resin substrate used in the method of the present invention is a resin substrate composed of any resin and having any shape, provided that it is a resin base that has physical properties that are appropriate for the objectives of use, such as strength and corrosion resistance. The resin bases that can be used in the present invention are not restricted to resin moldings, and can be composite materials formed by introducing reinforcing materials such as glass fiber and reinforcers into the resin. Alternatively, the material can be formed by providing a coating of resin on a base material composed of ceramic, glass, metal or various other components.

Any resin can be used for the resin substrate, and examples include high-density polyethylene, medium-density polyethylene, branched low-density polyethylene, linear low-density polyethylene, ultra-high molecular weight polyethylene and other polyethylene resins, polypropylene resin, polybutadiene, polybutene resin, polybutylene resin, polystyrene resin and other polyolefin resins; polyvinyl chloride resin, polyvinylidene chloride resin, polyvinylidene chloride-vinyl chloride copolymer resin, polyethylene chloride, polypropylene chloride, tetrafluoroethylene and other halogenated resins; AS resin; ABS resin; MBS resin; polyvinyl alcohol resin; polymethyl acrylate and other polyacrylate ester resins; polymethyl methacrylate and other polymethacrylate ester resins; methyl methacrylate-styrene copolymer resins; maleic anhydride-styrene copolymer resins; polyvinyl acetate resins; cellulose propionate resins, cellulose acetate resins and other cellulose resins; epoxy resin; polyimide resin; nylon and other polyamide resins; polyamidoimide resins; polyarylate resin; polyether imide resin; polyether [sic] ether ketone resin; polyethylene oxide resin; PET resin and various other polyester resins; polycarbonate resin; polysulfone resin; polyvinyl ether resin; polyvinyl butyral resin; polyphenylene oxide and other polyphenylene ether resins; polyphenylene sulfide resin; polybutylene terephthalate resin; polymethylpentene resin; polyacetal resin; vinyl chloride-vinyl acetate copolymer; ethylene-vinyl acetate copolymer; ethylene vinyl chloride copolymer; and other copolymer and blended thermoplastic resins, epoxy resin; xylene resin; guanamine resin; diallylphthalate resin; vinyl ester resin; phenol resin; unsaturated polyester resin; furan resin; polyimide resin; polyurethane resin; maleic acid resin; melamine resin; urea resin; and other thermosetting resins, as well as mixtures thereof. However, examples are not restricted to these. Preferred resins are epoxy resin, polyimide resin, vinyl resin, phenol resin, nylon resin, polyphenylene ether resin, polypropylene resin, fluorine-based resin and ABS resin, with preferred examples being epoxy resin, polyimide resin, polyphenylene ether resin, fluororesin and ABS resin, with epoxy resin and polyimide resin being especially desirable. The resin substrate can be composed of individual resins, or can be composed of multiple resins. In addition, the material can be a composite produced by coating or laminating resin onto another substrate.

Commercially available well-known palladium or palladium-tin catalysts can be used as the palladium or palladium-tin catalyst used in the present invention. The palladium or palladium-tin catalyst that is used can be used in the form of a catalyst solution in which the palladium or palladium-tin catalyst is present as colloid in the medium. For example, a material produced by diluting Crimson Activator 5300 palladium-tin catalyst (manufactured by Shipley Company), or Conductron DP-H Activator palladium-tin catalyst (manufactured by LeaRonal Japan Inc.) in predip solution can be used, but examples are not restricted to these. When a palladium-tin catalyst is used, the ratio of palladium to tin in said catalyst is typically in the range of 1:1 to 1:100, with 1:1 to 1:10 being preferred.

In step (1), the palladium or palladium-tin catalyst is first affixed to the resin substrate. Examples of catalyst affixing methods that can be used include any method that affixes catalyst to the resin substrate. Exampled that can be cited include, but are not restricted to, methods in which the resin substrate is immersed in catalyst liquid or methods in which the resin substrate is sprayed with catalyst liquids. By using a conditioner containing cationic surfactant or other such substance and carrying out immersion or spraying treatments as necessary prior to affixing the catalyst, affixing of palladium or palladium-tin catalyst on the resin substrate is facilitated. Consequently, a conditioning treatment, etching treatment or other such treatment can be carried out.

The catalyst concentration in the catalyst liquid used in the present invention is 30–500 mg/L in terms of palladium concentration, with 70–200 mg/L being preferred. If the palladium concentration is too low, then sufficient copper deposition will not be obtained in step (2) wherein treatment is carried out with an electroless copper plating bath containing reducing agent. If the palladium concentration is too high, on the other hand, adsorption of palladium catalyst will be excessive, and binding will decrease, thus increasing costs.

The treatment for affixing catalyst to the resin substrate is carried out by immersion of the resin substrate in the catalyst solution or spraying catalyst liquid on the resin substrate as described above. With vertical treatments, the affixing treatment time is typically 3–10 min, with 5–8 min being preferred. The affixing treatment temperature is typically 25–50° C., with 35–45° C. being preferred. For horizontal treatments, the affixing treatment time is ordinarily 15 sec to 3 min, with 30 sec to 2 min being preferred. The affixing treatment temperature for horizontal treatments is typically 25–50° C., with 35–45° C. being preferred.

The method for forming the method for manufacturing copper-resin composite materials of the present invention includes step (2): treating the substrate with affixed catalyst with an electroless copper plating bath containing copper ions and reducing agent, without performing a catalyst acceleration treatment, thereby forming a copper thin film on the resin substrate.

In step (2), a resin substrate having catalyst on its surface obtained by the above treatment, is treated with the electroless copper plating bath of the present invention without carrying out the acceleration treatment performed in ordinary electroless copper plating methods. In the present invention, the term "electroless copper plating bath" refers to a solution that allows the formation of a copper thin film on a substrate by means of contact with the substrate having palladium or palladium-tin catalyst on its surface, without performing an acceleration treatment. With ordinary electroless copper plating methods that employ formaldehyde, tin is removed from the palladium-tin catalyst in the catalyst acceleration process after affixing the catalyst. When catalyst that has not been subjected to an acceleration treatment is used, palladium with high catalytic activity with respect to formaldehyde is not exposed, so that the induction time for the electroless copper plating reaction is dramatically lengthened relative to catalysts that have been subjected to acceleration treatments. When a catalyst not subjected to an acceleration treatment is used, catalyst becomes admixed in the electroless copper plating bath, destabilizing the electroless copper plating bath, and causing decomposition.

In the present invention, the meaning of the phrase "without subjecting the catalyst to an acceleration treatment" means that a treatment for increasing the catalytic activity of the catalyst is not carried out as a single isolated process between the treatment for affixing the non-activated catalyst to the substrate and the subsequent electroless copper plating bath treatment. In the treatment carried out with the electroless copper plating bath of the present invention, when said electroless copper plating bath contains highly reactive reducing agent, the electroless copper plating reaction is carried out simultaneous with activation of the catalyst in the electroless copper plating bath. In this case, the catalytic activity of the catalyst is increased, but this activation is not carried out as a single isolated process. Thus, although the catalytic activity of the catalyst is increased by carrying out treatment with the electroless copper plating bath, the phrase "without subjecting the catalyst to an acceleration treatment" still applies.

Copper ions and reducing agent are contained in the electroless copper plating bath used in step (2), and thus by treatment with said electroless copper plating bath, a copper thin film is directly formed on the resin substrate. With the electroless copper plating method of the present invention, after affixing catalyst to the resin substrate, treatment is carried out with the electroless copper plating bath containing copper ions and reducing agent. Consequently, palladium or palladium-tin affixed as catalyst is present as a metal layer in the copper thin film formed on the resin substrate.

In the present invention, when the electroless copper plating bath does not contain formaldehyde, and the substrate with affixed catalyst is contacted with the electroless copper plating bath of the present invention, copper deposition is rapidly initiated, and copper covers the entire surface of the catalyst with completion of the reaction. The thickness of the copper coating upon completion of the copper deposition reaction can be adjusted in accordance with variations in various parameters, but is typically 0.01–0.2 $\mu$m, with 0.01–0.08 $\mu$m being preferred, and 0.03–0.08 $\mu$m being particularly desirable. Such deposits are thin relative to thicknesses of 0.2–0.5 $\mu$m which are common thicknesses for copper coatings obtained with the same catalysts and resin substrates by common electroless copper plating including acceleration methods that include acceleration treatment processes carried out using electroless copper plating baths containing formaldehyde.

The treatment carried out with the electroless copper plating bath in step (2) is carried out by immersing the resin substrate in electroless copper plating bath or by spraying the resin substrate with electroless copper plating bath.

Step (2) can be carried out in a horizontal process (also referred to as "horizontal treatment") in which the resin substrate is treated in a horizontal state, or by means of a vertical process (also referred to as "vertical treatment") wherein treatment is carried out with the resin substrate in a vertical state.

When the electroless copper plating bath does not contain formaldehyde, in vertical treatments, the solution treatment time is typically 1–5 min, with 1–2 min being preferred. In such vertical treatments, the solution treatment temperature is typically 30–70° C., with 50–60° C. being preferred. For horizontal treatments, the solution treatment time is ordinarily 15 sec to 2 min, with 30 sec to 1 min being preferred. The solution treatment temperature in horizontal treatments is typically 30–70° C., with 50–60° C. being preferred. In preferred modes of the electroless copper plating method of the present invention, the copper deposition time is short relative to cases where electroless copper plating is carried out with electroless copper plating bath containing formaldehyde using the same catalyst and resin substrate, and the treatment time of the entire system thus decreases accordingly.

When the electroless copper plating bath of step (2) contains formaldehyde, the deposited copper has an autocatalytic function, and so completion of deposition of the copper film as described above does not occur. Thus it is possible to form a copper thin film of an appropriate film thickness by increasing the treatment time. For vertical treatment, the solution treatment time is ordinarily 10–30 min, with 15–20 min being preferred. Typically, the solution treatment temperature is 20–70° C., with 25–30° C. being preferred. For horizontal treatment, the solution treatment time is ordinarily 5–30 min, with 10–20 min being preferred. In such horizontal treatments, the solution treatment temperature is typically 20–70° C., with 25–40° C. being preferred.

The source of the copper ions contained in the electroless copper plating bath does not matter, provided that the ions are present as copper ions in the electroless copper plating bath. For example, copper compounds that produce copper ions when dissolved in solution can be supplied to the solution, or the aforementioned compounds can be dissolved preliminarily in water to produce solution containing copper ions, which is then supplied to the bath. The copper compound that can be used as the aforementioned copper source can be any desired compound without any particular restrictions, provided that it is a substance that is water-soluble, contains elemental copper, and is well known in its use as a copper source in copper plating baths. Suitable copper compounds for use as copper sources include, but are not limited to, copper sulfate, copper chloride, copper nitrate, copper hydroxide, copper sulfamate, copper carbonate and copper oxide. Copper sulfate and copper chloride are particularly suitable. The copper compounds used as the above copper compound may be used individually, or mixtures of copper compounds may be used.

The concentration of copper ions in the electroless copper plating bath is ordinarily 0.5–5 g/L in terms of metallic copper conversion, with 1–2 g/L being preferred. However, the copper ion concentration can be 2 g/L or greater when the electroless copper plating bath of the present invention contains complexing agent, and the concentration thereof is high. The copper ion concentration can be as high as 10 g/L.

The reducing agent that is used in the electroless copper plating bath of step (2) may be any substance without particular restrictions, provided that it is water-soluble, and is a substance that allows the deposition of metallic copper on resin substrate by the reduction of copper ions. It is preferable for the reducing agent to be a reducing agent other than formaldehyde. Suitable reducing agents other than formaldehyde include, but are not limited to, sodium borohydride, potassium borohydride, dimethylaminoborane, trimethylaminoborane, hydrazine and derivatives of these various compounds. Other suitable reducing agents may also be used. Particularly useful reducing agents are sodium borohydride, potassium borohydride, dimethylaminoborane, trimethylaminoborane, hydrazine and derivatives of these various compounds. More particularly useful reducing agents are sodium borohydride and potassium borohydride, with sodium borohydride being even more useful. A single type of reducing agent can be used as the aforementioned reducing agent, or mixtures of reducing agents can be used.

The concentration of reducing agent in the electroless copper plating bath is typically 0.1–10 g/L, with 0.5–2 g/L being preferred.

The electroless copper plating bath of step (2) can contain any complexing agent. Such complexing agent can be any type of complexing agent, provided that it can form a complex from the copper ions. Exemplary complexing agents include, but are not limited to, polyamines and salts thereof, aminocarboxylic acids and salts thereof, aminoalkanol compounds and salts thereof, and oxycarboxylic acids and salts thereof, and the like. A single complexing agent or a mixture of complexing agents can be used.

Examples of polyamines and salts thereof include without limitation ethylenediamine, diethylenetriamine, diethylenetetraamine and triethylenetetraamine, and hydrochlorides and sulfates thereof.

Polyamines or salts thereof are typically used at a concentration of 1–100 g/L in the electroless copper plating bath, with 5–50 g/L being preferred.

Examples of aminocarboxylic acids and salts thereof include, without limitation, iminodiacetic acid and sodium salt thereof, nitrilotriacetic acid and sodium salt thereof, hydroxyethylethylenediaminetriacetic acid, tetrahydroxyethylenediamineacetic acid, dihydroxymethylethylenediaminediacetic acid, ethylenediaminetetraacetic acid, cyclohexane-1,2-diaminotetraacetic acid, ethyleneglycol diethyl ether diaminotetraacetic acid, ethylenediaminetetrapropionic acid, N,N,N',N'-tetrakis-(2-hydroxypropyl) ethylenediamine and sodium and potassium salts thereof. These compounds are generally used at a concentration of 1–100 g/L in the electroless copper plating bath, with 5–50 g/L being preferred.

Suitable aminoalkanol compounds are mono-, di- and triethanolamines, but examples are not restricted to these. Aminoalkanol compounds are generally used in the electroless copper plating bath at a concentration of 5–200 mL/L, with 50–100 mL/L being preferred.

Examples of oxycarboxylic acids include, but are not limited to, tartaric acid, citric acid and glycolic acid. Exemplary oxycarboxylates include, without limitation, sodium tartrate, potassium tartrate, sodium potassium tartrate, sodium citrate, potassium citrate, ammonium citrate, sodium gluconate and potassium gluconate. Such compounds are typically used in the electroless copper plating baths at concentrations of 1–100 g/L, with 5–50 g/L being preferred.

The electroless copper plating bath of step (2) can optionally contain water-soluble thallium compound, water-soluble cerium compound and/or water-soluble sulfide. When water-soluble thallium compound, water-soluble cerium compound and/or water-soluble sulfide is contained in the electroless copper plating bath, the stability of said solution is dramatically improved. It is preferable for the electroless copper plating bath to contain water-soluble thallium compound and/or water-soluble cerium compound.

Elemental thallium and cerium are included among the water-soluble thallium compounds and water-soluble cerium compounds that can be contained in the electroless copper plating bath. Any compound without particular restrictions can be used, provided it is a compound that is soluble in the electroless copper plating bath. In addition, elemental sulfur is included in the form sulfides as the water-soluble sulfide that may be contained in the electroless copper plating bath, and any compound can be used without particular restriction, provided that it is a compound that is soluble in the electroless copper plating bath. Such water-soluble thallium compound, water-soluble cerium compound and water-soluble sulfide compounds can contain one element selected from cerium, thallium and sulfide, or can contain multiple elements selected from cerium, thallium and sulfide. Such compounds may be used individually or in mixtures.

The aforementioned water-soluble thallium compound, water-soluble cerium compound and/or water-soluble sulfide can be directly dissolved in electroless copper plating bath, or the aforementioned compound can first be dissolved in water, and then added to the liquid as solution.

Examples of water-soluble cerium compounds include, but are not limited to, cerium acetate, cerium nitrate, cerium sulfate, cerium bromide, cerium carbonate, cerium chloride, cerium fluoride, cerium oxalate and other salts and hydrates thereof. Exemplary water-soluble thallium compounds include, but are not limited to, thallium chloride, thallium formate, thallium nitrate, thallium oxide, thallium sulfate, thallium acetate and other salts and hydrates thereof. Suitable sulfides include, without limitation, alkali metals and alkaline earth metal sulfides. Particularly useful water-soluble sulfides include sodium sulfide, sodium hydrogen sulfide, potassium sulfide, potassium hydrogen sulfide, barium sulfide, barium hydrogen sulfide, magnesium sulfide and magnesium hydrogen sulfide. Preferred water-soluble sulfides are sodium sulfide, sodium hydrogen sulfide, potassium sulfide and potassium hydrogen sulfide.

The amount of water-soluble thallium compound, water-soluble cerium compound and/or water-soluble sulfide in the electroless copper plating bath is that amount sufficient to stabilize the electroless copper plating bath. Typically, the water-soluble cerium compound is used in an amount of 1–1000 mg/L, with 5–30 mg/L being preferred. The water-soluble thallium compound is typically used at 1–1000 mg/L, with 5–30 mg/L being preferred. Typically, the water-soluble sulfide is used at 1–1000 mg/L, with 5–20 mg/L being preferred.

Iodine and/or water-soluble iodine compound may be contained in the electroless copper plating bath of step (2). It is preferable for the electroless copper plating bath of the present invention to contain iodine and/or water-soluble iodine compound. When iodine and/or water-soluble iodine compound is contained in the electroless copper plating bath, the stability of the electroless copper plating bath is improved, and the deposition rate of copper is improved. It is advantageous for the electroless copper plating bath to contain elemental iodine, because the stability of the electroless copper plating bath and the copper deposition rate are simultaneously improved. This effect can be achieved under ordinary conditions in the electroless copper plating method of the present invention.

When the electroless copper plating bath contains elemental iodine, the deposited copper has a fine grain, and as a result, the copper film has good luster, which is advantageous in terms of manifesting the color tone of metallic copper. In the electroless copper plating method of the present invention, when the electroless copper plating bath does not contain elemental iodine, there is no metallic copper tone, and the copper color is manifested without luster. The external appearance of deposited copper coatings is considered important in electroless copper plating industries, and in particular, the manifestation of gloss under visual observation is desirable. Consequently, the addition of elemental iodine is advantageous from this standpoint.

Any compound that contains iodine and is soluble in the electroless copper plating bath can be used without particular restrictions. The water-soluble iodine compound can contain iodine in any form. For example, iodine can be present in the form of iodide salt as in potassium iodide, ammonium iodide, sodium iodide and thallium iodide, or in a form wherein iodine is covalently bonded to organic compound, as in 1,3-dichloro-4-iodobenzene, 8-hydroxy-7-iodo-5-quinolinesulfonic acid and iodobenzoic acid. A single iodine-containing compound or a mixture of such compounds may can be used.

The water-soluble iodine compound can be a compound that is contained simultaneously as another compound that is useful in the present invention, as with thallium iodide. The iodine and/or water-soluble iodine compound can be dissolved directly in the electroless copper plating bath, or the aforementioned compound can be first dissolved in water, and this solution can be added to the solution. It is preferable for the electroless copper plating bath to contain iodine compound.

While not wishing to be bound by theory, it is thought that the presence of iodine on the resin substrate accelerates the copper deposition reaction in the electroless copper plating treatment by means of adsorbing to palladium catalyst or palladium-tin catalyst that has not been subjected to an acceleration treatment. In addition, because iodine exhibits the aforementioned effects whether in the form of iodide ions or in a form whereby it is covalently bonded to a compound, it is thought that the elemental iodine itself acts on the palladium catalyst or palladium-tin catalyst.

The iodine and/or water-soluble iodine compound contained in the electroless copper plating bath of the present invention will not manifest copper deposition acceleration effects if present in too small an amount. On the other hand, the substance will inactivate the palladium catalyst or palladium-tin catalyst if present in too large an amount. For this reason, the amount of iodine and/or water-soluble iodine compound contained in the electroless copper liquid is typically 1–1000 mg/L in terms of the weight of iodine, with 5–30 mg/L being preferred, and 10–20 mg/L being additionally desirable.

The electroless copper plating bath of step (2) can also optionally contain hydantoin and/or hydantoin derivatives. When hydantoin and/or hydantoin derivatives are used, the copper deposition rate is increased. It is preferable for the electroless copper plating of the present invention to contain one or more hydantoin derivatives. Any compound having a hydantoin moiety in its structure can be used in the electroless copper plating bath. In addition, other suitable compounds are those compounds derived by cracking the hydantoin rings, as with hydantoic acid. The hydantoin derivative can be any compound without particular restrictions, provided that the compound is soluble in the electroless copper plating bath. A single such compound or a mixture of such compounds may be used.

Examples of hydantoin and/or hydantoin derivatives contained in the electroless copper plating bath of step (2) include, but are not limited to, hydantoin, hydantoic acid, 1-methylhydantoin, 5,5-diphenylhydantoin, 5,5-dimethylhydantoin, 1,5,5-trimethylhydantoin, and derivatives thereof. Particularly useful compounds are 5,5-dimethylhydantoin and 5,5-diphenylhydantoin. The hydantoin and/or hydantoin derivative is typically present at a concentration of 1–100 g/L in the electroless copper plating bath of step (2), with 5–50 g/L being preferred.

Various additives can optionally be blended as necessary in the electroless copper plating bath of step (2). Examples of such additives include, but are not limited to, pH adjusters and coating reformers. The pH adjusters act to accelerate the reduction reaction whereby copper ions are deposited as copper by means of maintaining the pH of the electroless copper plating bath at the desired value. Suitable pH adjusters include, but are not limited to, sulfuric acid, hydrochloric acid, phosphoric acid and other inorganic acids, and sodium hydroxide, potassium hydroxide and other hydroxides. The pH adjuster is added in an amount sufficient to adjust the pH of the electroless copper plating bath to a desired value. The pH of the electroless copper plating bath used in the electroless copper plating method is preferably 10 or greater, with 13 or greater being preferred.

The coating reformer improves the physical properties of the copper thin film produced. Examples of such physical properties are, without limitation, extension, tensile strength, hardness and internal stress. The reformer may also aid in producing finer deposited copper grains. Examples of coating reformers include, but are not limited to, thio compounds and other sulfur-containing compounds, 2,2'-bipyridyl, 1,10-phenanthroline, potassium ferrocyanate, ethylene oxide surfactant and polyethylene glycol. These additives can be used individually or mixtures of such additives may be used.

The amount of such additives in the electroless copper plating bath of step (2) can be determined appropriately so that each of the additives exhibits the desired effects. For example, thio compound is typically present at a concentration of 1–100 mg/L, with 5–10 mg/L being preferred. Bipyridine is typically present at a concentration of 1–50 mg/L, with 5–15 mg/L being preferred. Surfactant is typically present at a concentration of 1–500 mg/L, with 10–20 mg/L being preferred.

The method for forming copper-resin composite materials of the present invention includes step (3): subjecting the resin substrate having said copper thin film to an electrolytic copper plating treatment prior to the formation of oxide film on the copper thin film surface of the resin substrate to form a copper-resin composite intermediate material.

The oxide film refers to films including copper (I) oxide and copper (II) oxide. The term "prior to formation of oxide film on the copper thin film surface" in step (3) means prior to the formation of an oxide film to the degree that there is a detrimental influence on the method for manufacturing copper-resin composite material that is finally manufactured by the method of the present invention due to this formation of the oxide film prior to the electroless copper plating treatment in step (3). A situation where there is substantially no formation of oxide coating is preferred, and a situation in which there is no formation of oxide coating is particularly desirable.

In step (3), the resin substrate having a copper thin film is subjected to electroless copper treatment prior to formation of the oxide coating, and so the metal binding between the electroless copper layer and electrolytic copper layer is firm, and a copper plated coating with high connection reliability is obtained.

The electroless copper plating treatment in step (3) may be carried out at any time, provided that it is prior to the formation of oxide film on the copper thin film surface formed in step (2). The following modes can be offered in terms of specific relationships between steps (2) and (3).

In the first mode, a mode is offered in which step (3) is carried out immediately after step (2). An example of this mode involves completion of the electroless copper plating treatment in step (2), followed by removal of the resin substrate having the copper thin film from the electroless copper plating bath, and removing the electroless copper plating bath adhered to said resin substrate by rinsing with water. Prior to evaporation of the water content, the resin substrate is then immersed in the electroless copper plating bath, and electrolytic copper plating is carried out. Water washing in this mode can be carried out as desired, and washing with water or other solution can be carried out, or some other treatment may be carried out.

The electrolytic copper plating treatment in step (3) and the electroless copper plating treatment in step (2) can be carried out in a single line, or they may be carried out in separate lines. When carried out in separate lines, it is necessary for step (3) to be carried out immediately after step (2), as described in the above mode. In addition, the electrolytic copper plating treatment of step (3) and the electroless copper plating treatment of step (2) can be carried out in any configuration such as a horizontal or vertical process, or these configurations can be combined.

When steps (2) and (3) are carried out as horizontal processes and a copper thin film of 2 $\mu$m is formed, in general, it is possible to carry out the steps using 5 minutes for the electroless copper plating treatment of step (2), and about 3 minutes for the electrolytic copper plating treatment of step (3), or specifically, in a total time of about 8 minutes. On the other hand, when a copper thin film of 2 $\mu$m is formed by a thick electroless copper plating treatment carried out using a conventional method, about 20 minutes is required for horizontal processing. Thus, the method of the present invention has the advantage of allowing the manufacture of a copper-resin composite intermediate material in less than half the time that it takes for thick electrolytic copper plating carried out using a conventional method.

In order to increase treatment time in horizontal processes, it is necessary to lengthen the processing line or slow the transport rate of resin substrate on the line. However, in cases where it is not possible to slow the transport rate, the processing line itself is lengthened, and so the size of the device must be increased. In this regard, because the present invention has the advantage that the time required for copper thin layer formation is shorter than when thick electroless copper plating treatments are carried out by conventional methods, the device can be made smaller in size, particularly for horizontal processes.

Thus, in the present invention, it is preferable for both steps (2) and (3) to be carried out as horizontal processes. Carrying out step (2) and step (3) as horizontal processes is particularly advantageous in modes in which step (3) is carried out immediately after step (2), but advantage is not restricted to this mode, as advantages are also had in any other mode, including the mode types described below.

Another example is a mode wherein step (3) involves retaining the resin substrate having the copper thin film obtained in step (2) in an oxidation-preventing retention liquid, so that the resin substrate having said copper thin film is subjected to electrolytic copper plating treatment prior to formation of an oxide film on the surface of the copper thin film present on the resin substrate. This mode controls formation of oxide film because the resin substrate having the copper thin film is retained in a retention liquid for preventing oxidation. The oxidation-preventing retention liquid referred to herein can be any solution that is commonly used, provided that it prevents oxidation of the copper thin film, and does not have a detrimental influence on the copper thin film. Examples include, but are not restricted to, mixed solutions of formaldehyde and alkali, and diluent for the electroless copper plating bath.

A further example is a mode wherein step (3) involves drying and retaining the resin substrate having copper thin film obtained in step (2) in a non-oxidative atmosphere, and then subjecting the resin substrate having said copper thin film to an electrolytic copper plating treatment prior to the formation of an oxide film on the copper thin film surface on the substrate. In this mode, water rinsing of the resin substrate can be carried out as desired between the electrolytic copper plating treatment and drying process. In this mode, formation of the oxide film is controlled by drying and retaining the resin substrate having the copper thin film in a non-oxidative atmosphere. The non-oxidative atmosphere referred to herein denotes an atmosphere that does not cause the copper thin film to undergo oxidation reactions, and preferably, is an atmosphere whereby other reactions that are not oxidation reactions also do not occur at the copper thin film. Examples include, but are not restricted to, nitrogen gas, helium, neon, argon and other noble gases.

With regard to the electrolytic copper plating treatment in step (3), any electrolytic copper plating method can be used, provided that it allows deposition of electrolytic copper on the copper thin film. Any material that is used in electrolytic copper plating may be used without particular restrictions as the composition of the electrolytic copper plating solution used in the electrolytic copper plating treatment. Examples include, but are not limited to, copper sulfate plating bath, copper cyanide plating bath and copper pyrophosphate plating bath. It is preferable for the electrolytic copper plating bath to be a copper sulfate plating bath. In addition, it is possible to add additives, change concentrations, and change the basic composition appropriately, provided that the objectives of the present invention are still attained. For example, with copper sulfate plating, the copper sulfate plating bath is an aqueous solution that contains, as its basic composition, sulfuric acid, copper sulfate and water-soluble chlorine compound, but the basic composition of said plating bath has no particular restrictions, provided that it is a composition that is used in well-known copper sulfate plating processes.

Any type of current may be used in the electrolytic copper plating step. Examples include without limitation alternating current, direct current and PPR (pulse periodic reverse current; current produced by repeating forward electrolysis and reverse electrolysis in a short period so that the direction of the current is periodically changed in a pulsed waveform). The positive electrode current density that is employed is to be determined appropriately depending on the type of plating bath. The positive electrode can be a soluble positive electrode or insoluble positive electrode, without particular restrictions.

The copper thin film in the method for manufacturing copper-resin composite intermediate material formed in step (3) can be set at any thickness using the electrolytic copper plating treatment parameters of step (3). However, from the standpoint of endowing the material with resistance to the etching process or polishing process carried out subsequently in step (4), the lower limit of the thickness is 0.1 $\mu$m, with 0.5 $\mu$m being preferred. The upper limit of the thickness will be different depending on the desired characteristics of the method for manufacturing copper-resin composite materials by the method of the present invention, but the limit is preferably 3 $\mu$m, with 2 $\mu$m being especially desirable. The upper and lower limits on the copper thin film thickness can be set in any combination, but 0.1–3 $\mu$m is preferred, with 0.5–2 $\mu$m being especially desirable.

The copper-resin composite intermediate material manufactured in steps (1)–(3) has a thicker copper thin film relative to copper thin films formed by ordinary electroless copper plating treatments (excluding thick electroless copper plating treatments), which results the advantage that the material can be readily handled subsequently.

The copper that has been deposited in step (2) constitutes a uniform fine copper thin film, and so the copper thin film formed by means of the electrolytic copper plating treatment of step (3) also is uniform and fine. Thus, although thick electroless copper plating can be carried out in order to form a copper thin film having a thickness that is equivalent to the thickness of the copper-resin composite intermediate material manufactured by steps (1)–(3) of the present invention, when thick electroless copper plating treatments are carried out, the deposited copper is composed of porous deposited material. As a result, the deposition condition of the copper differs from the fine solid deposited matter of the type deposited in steps (3) of the present invention. Due to the difference in the deposited material, the copper thin film of the copper-resin composite intermediate material of the present invention has superior characteristics in regard to extension, tensile strength and hardness, relative to copper thin films formed by thick electroless copper plating treatments.

The method for forming the copper-resin composite materials of the present invention also includes step (4): etching or polishing the copper-resin composite intermediate material.

In step (4), the copper-resin composite intermediate material is subjected to an etching treatment or polishing treatment, where an oxide film can be present or absent on the copper thin film of said copper-resin composite intermediate material. When an oxide film is present, said oxide film can cover the entire surface of the copper thin film, or can partially cover the surface. For example, the copper-resin composite intermediate material formed in step (3) can be immediately subjected to step (4), or can be retained in an oxidation-preventing retaining liquid, or can be retained in a non-oxidative atmosphere. By this means, the material can be subjected to step (4) prior to the formation of an oxide film. In such a case, the copper-resin composite intermediate material will not have an oxide film in step (4). Alternatively, the copper-resin composite intermediate material formed in step (3) can be dried and stocked in air. In such a case, an oxide film will be formed.

There are no particular restrictions on the conditions of the polishing treatment or etching treatment of step (4), and any conditions may be used depending on objectives to effect an etching treatment or polishing treatment that will increase binding with the resist, or an etching treatment or polishing treatment that will remove oxide film. Thus, the conditions can be determined so that any desired thickness of the copper thin film is removed. The etching treatment or polishing treatment can be carried out as a single treatment, or multiple treatments can be carried out. When multiple treatments are carried out, any type of etching treatment and polishing treatment can be carried out in any combination. In addition, any other treatment may also be carried out between the etching treatment and polishing treatment.

The etching treatment can be any type of treatment such as chemical etching or physical etching. Suitable chemical etching treatments include, but are not restricted to, etching treatments such as immersion etching, spray etching, foam etching or paddle etching methods that employ etchants such as ammonia alkaline etching liquid, sulfuric acid-hydrogen peroxide etching liquid, cupric chloride etching liquid, persulfate etching liquid, ferric chloride etching liquid and chromic acid-sulfuric acid mixed etching liquid. Examples of physical etching treatments include, but are not restricted to, sputter etching and reactive ion etching. Examples of polishing treatments include, but are not restricted to, buff polishing, brush polishing, and sand-blast treatments.

The method for forming the copper-resin composite materials of the present invention also includes step (5): subjecting the etched or polished copper-resin composite intermediate material to an electrolytic copper plating treatment or pattern formation treatment to form the copper-resin composite material.

Any well-known electrolytic copper plating treatment may be used for the electrolytic copper plating treatment in step (5), and for example, modes of the type described in step (3) above may be used, but examples are not restricted to these.

The pattern formation treatment used in step (5) may be any treatment whereby a pattern of copper thin film is formed on the copper-resin composite intermediate material. Examples include, but are not limited to, the semi-additive method and pattern plating method. There are no particular restrictions on the resist, dry films, resist stripping liquid or etching liquid and other materials used in the pattern formation treatment, or on the treatment parameters, and any well-known materials and treatment parameters that are commonly used in pattern formation may be used. Moreover, step (5) can also include treatments other than electrolytic copper plating and pattern formation as desired in accordance with the copper-resin composite material that is to be manufactured in the end. For example, a plating treatment using metal other than copper may be carried out, but examples are not so restricted.

For example, with the semi-additive method, imaging is carried out on a physically polished copper-resin composite intermediate material using a dry film, and subsequently, copper circuitry is formed by means of pattern copper plating, dry film stripping and final etching carried out in sequence. With pattern plating method, imaging is carried out using a dry film on a copper-resin composite intermediate material that has been physically polished. Subsequently, copper circuitry is formed by pattern copper plating, metal resist plating, dry film stripping, final etching and metal resist stripping carried out in sequence.

With pattern formation methods such as the semi-additive method and pattern plating method, when a material formed by means of thick electroless copper plating is used for the copper-resin composite intermediate material, even if polishing or other treatment is carried out beforehand, the deposited copper is in a porous state, so that the copper oxide coating cannot be completely removed from the thick electroless copper thin film. When an electrolytic copper plating treatment is then carried out for pattern copper plating, nodules, pits and other undesirable manifestations tend to appear, which are caused by the copper oxide.

In contrast, when the copper-resin composite intermediate material of the present invention is used, the copper-resin composite intermediate material will have a fine uniform electrolytic copper layer, and so even if a copper oxide film is formed, it can be adequately removed by polishing or other treatment, and binding between the copper thin film and dry film are improved. As a result, the undesirable manifestation of nodules and pits that occur during pattern formation as described above can be avoided.

In addition, because copper that is deposited by electrolytic copper plating treatments and copper that is deposited by thick electroless copper plating treatments are different in terms of the form of the deposited copper, when the copper-resin composite intermediate material is formed by thick electroless copper plating, the copper layer in the copper-resin composite material that is obtained in the end will be composed of two layers consisting of electroless copper and electrolytic copper that have completely different deposition forms.

In contrast, the copper thin film in the copper-resin composite intermediate material formed in steps (1)–(3) of the present invention will be composed of an extremely thin electroless copper layer, along with the remaining electrolytic copper that accounts for most of the material. The method for manufacturing copper-resin composite materials of the present invention involves the formation of an electrolytic copper layer on the copper thin film of the copper-resin composite intermediate material. Thus, the copper layer in the resulting copper-resin composite intermediate material has a thin electroless copper layer that has been deposited in step (2), but most of it is composed of electrolytic copper.

The lines that constitute the circuit patterns are preferably formed from uniform copper, and in the method of the present invention, the copper that constitutes the circuit pattern is substantially composed only of electrolytic copper, and so circuits can be formed that are superior relative to those formed by thick electroless copper plating treatments composed of an electrolytic copper and electroless copper layer.

In addition, when a copper-resin composite intermediate material is used that has been manufactured by performing electrolytic copper plating after a conventional electroless copper plating treatment, although the electroless copper layer is thin relative to cases where a thick layer is formed, the layer is thicker relative to the material of the present invention. Thus, superior circuits can be formed by the method of the present invention relative to circuits formed by common electroless copper plating treatments.

The various processes in the working examples and comparative examples presented below employ commercially-available reagents commonly used in the respective processes, unless otherwise specifically indicated. The processes were carried out under commonly used conditions. A copper-clad 4-layer plate (manufactured by Hitachi Kasei) with a plate thickness of 1.6 mm composed of glass fiber and bisphenol A epoxy resin (FR-4) was used for the resin substrate.

EXAMPLE 1

As shown in Table 1 below, the resin substrate was treated by an electroless copper plating method without performing a catalyst acceleration treatment using the electroless plating bath compositions shown in the table, following the sequence: conditioning, etching, Pd—Sn catalyst affixing and electroless copper plating. However, with sample no. 13, processing was carried out using the sequence: etching, conditioning, catalyst affixing, electroless copper plating. After the electroless copper plating treatment, the resin substrate was washed with water for 1 min, and was immersed in the sulfuric acid copper plating bath. In this processing sequence, subsequent processes were carried out immediately following each process without drying the copper thin film on the resin substrate.

Next, electrolytic copper plating was carried out at a current density of 2 A/dm$^2$, to form a copper-resin composite intermediate material having a 2 μm copper thin film. With the processes indicated as "vertical", both the electroless copper plating and electrolytic copper plating were carried out as vertical processes. With the processes indicated as "horizontal", both processes were carried out as horizontal processes.

Subsequently, the material was placed in air for 1 week to allow an oxide film to form on the copper thin film. The aforementioned copper-resin composite intermediate material was then treated for 30 seconds in sodium persulfate 60 g/L solution and the surface copper was etched at 0.3 μm. Subsequently, activation was carried out in 10% sulfuric acid, and a common sulfuric acid copper plating treatment was carried out at 2 A/dm$^2$ to form a copper-resin composite material having a 25 μm copper layer.

The copper-resin composite material was investigated, and with sample nos. 1–13, it was found in regard to performance evaluation, that there was no separation between the internal layer copper foil and electrolytic copper film, even after 100 cycles in a heat resistance test (260° C. oil/10 sec, 25° C. methanol/10 sec). In addition, 100 holes of hole diameter 0.3 mm were observed in the electrolytic copper plating, and it was determined that the void ratio was 0%.

TABLE 1

| Sample no. | 1 | 2 | 3 | 4 | 5 | 6 | 7 | 8 | 9 | 10 | 11 | 12 | 13 |
|---|---|---|---|---|---|---|---|---|---|---|---|---|---|
| Electroless copper plating treatment (treatment time) | | | | | | | | | | | | | |
| Conditioning (60° C.) | 5 min | 5 min | 5 min | 5 min | 5 min | 5 min | 15 sec | 15 sec | 15 sec | 5 min | 5 min | 5 min | Etching (25° C.) 15 sec |
| Etching (25° C.) | 1 min | 1 min | 1 min | 1 min | 1 min | 1 min | 15 sec | 15 sec | 15 sec | 1 min | 1 min | 1 min | Conditioning (45° C.) 15 sec |
| Pd-Sn catalyst affixing (43° C.) | 5 min | 5 min | 5 min | 5 min | 5 min | 5 min | 30 sec | 30 sec | 30 sec | 5 min | 5 min | 5 min | Pd-Sn catalyst affixing (43° C.) 30 sec |
| Electroless copper plating treatment (60° C.) | 5 min | 5 min | 2 min | 2 min | 1 min | 1 min | 30 sec | 30 sec | 30 sec | 1 min | 1 min | 20 min | Electroless copper plating (60° C.) 30 sec |
| Process (horizontal or vertical) | Vertical | Vertical | Vertical | Vertical | Vertical | Vertical | Horizontal | Horizontal | Horizontal | Vertical | Vertical | Vertical | Horizontal |
| Electroless copper plating bath composition | | | | | | | | | | | | | |
| pH | 12.5 | 12.5 | 13.0 | 13.0 | 12.5 | 12.5 | 13.0 | 13.0 | 13.0 | 13.0 | 13.0 | 12.5 | 14.0 |
| Copper sulfate pentahydrate | 15 g/L | 15 g/L | 15 g/L | 15 g/L | 4 g/L | 4 g/L | 4 g/L | 4 g/L | 4 g/L | 4 g/L | 4 g/L | 4 g/L | 4 g/L |
| EDTA | 45 g/L | 45 g/L | — | — | — | — | — | — | — | — | — | 45 g/L | — |
| Dimethyl hydantoin | — | — | 30 g/L | 30 g/L | 30 g/L | 30 g/L | 30 g/L | 30 g/L | 30 g/L | — | — | — | 40 g/L |
| Triethanolamine | — | — | — | — | — | — | — | 4 g/L | 4 g/L | 4 g/L | 4 g/L | — | — |
| Sodium borohydride | 1 g/L | 1 g/L | 0.5 g/L | 0.5 g/L | 0.5 g/L | 0.5 g/L | 0.5 g/L | 0.5 g/L | 0.5 g/L | 0.5 g/L | 0.5 g/L | — | 1 g/L |
| Formaldehyde | — | — | — | — | 10 mg/L | — | 10 mg/L | — | — | — | — | 20 g/L | — |
| 2,2'-Bipyridyl | 10 mg/L | 10 mg/L | 10 mg/L | — | — | — | — | — | — | — | — | 10 mg/L | — |
| Thallium sulfate | — | 14 mg/L | 14 mg/L | 14 mg/L | — | — | — | — | — | — | — | — | — |
| 1,10-Phenanthroline | — | — | — | 10 mg/L | 15 mg/L | 15 mg/L | 15 mg/L | 15 mg/L | 15 mg/L | — | — | — | — |
| Cerium acetate | — | — | — | — | 10 mg/L | 10 mg/L | — | — | — | — | 10 mg/L | — | 25 mg/L |
| Potassium iodide | — | — | — | — | — | 10 mg/L | — | — | — | — | — | — | — |
| Potassium ferrocyanide | — | — | — | — | — | — | — | — | — | — | — | — | — |
| 8-Hydroxy-7-iodo-5-quinolinesulfonic acid | — | — | — | — | — | — | 10 mg/L | 10 mg/L | 10 mg/L | — | — | — | — |
| Sodium sulfide | — | — | — | — | — | — | — | 10 mg/L | 10 mg/L | — | — | — | — |
| Thallium chloride | — | — | — | — | — | — | — | — | — | 15 mg/L | — | — | — |
| Sodium iodide | — | — | — | — | — | — | — | — | — | 10 mg/L | — | — | — |

Comparative Example 1

Copper-resin composite materials having 25 μm copper layers were formed in the same manner as in Working Example 1, with the exception that an electroless copper plating treatment was not carried out after treatment by the electroless copper plating method in which catalyst activation was not carried out in sample nos. 1–13, and the thickness of the copper layer that had been stripped by etching was 0.05 μm or less.

Upon investigating the copper-resin composite materials, it was found, in regard to performance evaluation, that separation of the electrolytic copper plating film and the internal layer copper foil occurred at a ratio of 3% after 100 cycles in a heat resistance test (260° C. oil/10 sec, 25° C. methanol/10 sec). 100 holes of hole diameter 0.3 mm were observed, and voids in the electrolytic copper plating were found at a ratio of 2–7%.

As is clear from the results of Comparative Example 1, when the copper-resin composite intermediate materials manufactured by means of this electroless copper plating method not involving a catalyst activation treatment were subjected to electrolytic copper plating prior to oxide film formation, it was clear that undesirable conditions in terms of void formation and peeling of the copper film occurred in the copper-resin composite materials that were eventually manufactured when an etching treatment was subsequently carried out.

On the other hand, as is clear from the results of Example 1, when the electrolytic copper plating method not involving catalyst activation pertaining to the present invention was carried out, and electrolytic copper plating was then carried out prior to formation of the oxide film, no undesirable conditions arose in terms of peeling of the copper film or void formation in the copper-resin composite material that was eventually obtained, even when etching was subsequently carried out in the production of the copper-resin composite intermediate material.

The present invention pertains to a copper-resin composite intermediate material formed by means of affixing palladium or palladium-tin catalyst on a resin substrate not having sufficient capacity to withstand conventional etching treatments or polishing treatments. Treatment with an electroless copper plating bath containing copper ions and reducing agent is then performed without carrying out a catalyst activation treatment using sulfuric acid or other substance. In addition, after said electroless copper plating treatment, an electrolytic copper plating treatment is carried out prior to formation of oxide film on the copper thin film, thus manufacturing a copper-resin composite intermediate material. By this means, the capacity to withstand subsequent etching treatments or polishing treatments is increased, and subsequent ease of handling is improved. In addition, metal binding between the electroless copper layer and electrolytic copper layer is strengthened, leading to superior connection reliability.

The method for forming the copper-resin composite material of the present invention involves the use of the aforementioned copper-resin composite intermediate material having improved capacity to withstand etching and polishing treatments, so that the copper-resin composite material that is eventually obtained will have decreased copper film peeling, and nodule, pit and void formation. This will have the effect of allowing manufacture of copper-resin composite intermediate materials with improved quality.

Moreover, when the copper-resin composite intermediate material of the present invention is used, said copper-resin composite intermediate material has a fine-grained uniform electrolytic copper layer, and so when, for example, a copper oxide film is formed thereupon, it can be adequately removed by polishing, etc. Moreover, the tightness between the copper thin film and dry films is improved, so that it is possible to reduce the occurrence of nodules, pits and other undesirable phenomena in pattern formation that readily occur when materials are formed by thick electroless copper plating processes using conventional methods.

The present invention involves manufacture of a copper-resin composite intermediate material using a specific electroless copper plating method that allows rapid deposition of electrolytic copper, and thus the invention has the effect of allowing the manufacture of copper-resin composite intermediate materials having etching and polishing resistance equivalent to materials manufactured by common thick electrolytic copper plating treatments, but at reduced production costs and in shorter processing times. In addition, the manufacture processes for the copper-resin composite materials are more efficient, so that the invention has the effect of allowing enhanced efficiency in regard to treatment time, production costs and other aspects of the copper-resin composite material manufacture process as a whole.

In particular, processing lines for horizontal processes can be shortened relative to conventional thick electrolytic copper plating treatments, which has the effect of reducing the size of the copper-resin composite material manufacture device.

In addition, the copper-resin composite intermediate material of the present invention has a copper thin film that is uniform and fine-grained. This has the effect of providing superior extension, tensile strength and hardness relative to copper thin films composed of porous copper deposited material formed by conventional thick electroless copper plating treatments.

The copper that constitutes the circuit pattern in the copper-resin composite material that is manufactured by the method of the present invention has an extremely fine-grain electroless copper layer, but most of the material is electrolytic copper. For this reason, the method of the present invention provides an effect whereby a circuit pattern with superior electrical properties can be formed, relative to circuit patterns produced by thick electroless copper plating treatments composed of an electrolytic copper layer and a comparatively thick electroless copper layer.

Additionally, with copper-resin composite intermediate materials manufactured by carrying out an electrolytic copper plating treatment subsequent to a common electroless copper plating treatment, the electroless copper layer will be thin relative to cases where thick electroless plating is performed. However, this layer will be thick relative to that of the present invention, and thus the circuit pattern manufactured by the present invention will have superior electrical properties in comparison.

What is claimed is:

1. A method for manufacturing copper-resin composite materials, which comprises 1) affixing palladium or palladium-tin catalyst onto a resin substrate, 2) treating the resin substrate with affixed catalyst with an electroless copper plating bath comprising copper ions and reducing agent, without performing a catalyst acceleration treatment, to form a copper thin film on the resin substrate, 3) subjecting the resin substrate having said copper thin film to an electrolytic copper plating treatment prior to the formation of oxide film on the copper thin film surface of the resin substrate, to form a copper-resin composite intermediate material, (4) etching or polishing the copper-resin composite intermediate material, and 5) subjecting the etched or polished copper-resin composite intermediate material to an electrolytic copper plating treatment or pattern formation treatment to form the copper-resin composite material.

2. The method of claim 1, wherein the thickness of the copper thin film in the copper-resin composite intermediate material formed by the electrolytic copper plating treatment of step (3) is 0.1–3 μm.

3. The method of claim 1, wherein the copper-resin composite intermediate material has an oxide film formed on the copper thin film surface.

4. The method of claim 1, wherein step (3) is carried out immediately following step (2).

5. The method of claim 1, wherein steps (2) and (3) are horizontal processes.

6. The method of claim 1, wherein the electroless copper plating bath in (2) does not contain formaldehyde.

7. A copper-resin composite material formed by the method of claim 1.

8. A method for manufacturing copper-resin composite intermediate materials comprising the steps of 1) affixing palladium or palladium-tin catalyst onto a resin substrate, 2) treating the resin substrate with affixed catalyst with an electroless copper plating bath comprising copper ions and reducing agent chosen from sodium borohydride, potassium borohydride, dimethylaminoborane, trimethylaminoborane, hydrazine and derivatives thereof, without performing a catalyst acceleration treatment, to form a copper thin film on the resin substrate, and 3) subjecting the resin substrate having said copper thin film to an electrolytic copper plating treatment prior to formation of oxide film on the copper thin film surface of the aforementioned resin substrate, to form a copper-resin composite intermediate material.

9. The method of claim 8, wherein steps (2) and (3) are horizontal processes.

10. The method of claim 8, wherein the thickness of the copper thin film is 0.1–3 μm.

11. The method of claim 8, wherein the electroless copper plating bath further comprises a compound chosen from a water-soluble thallium compound, a water soluble cerium compound, a water-soluble sulfide compound, iodine and a water-soluble iodine compound.

12. A method for manufacturing copper-resin composite intermediate materials comprising the steps of 1) affixing palladium or palladium-tin catalyst onto a resin substrate, 2) treating the resin substrate with affixed catalyst with an electroless copper plating bath comprising copper ions, reducing agent and a compound chosen from water-soluble thallium compound, a water soluble cerium compound, a water-soluble sulfide compound, iodine and a water-soluble iodine compound, without performing a catalyst acceleration treatment, to form a copper thin film on the resin substrate, and 3) subjecting the resin substrate having said copper thin film to an electrolytic copper plating treatment prior to formation of oxide film on the copper thin film surface of the aforementioned resin substrate, to form a copper-resin composite intermediate material.

* * * * *